(12) United States Patent
Briefer

(10) Patent No.: US 6,191,722 B1
(45) Date of Patent: Feb. 20, 2001

(54) PULSE WIDTH MODULATION DIGITAL TO ANALOG CONVERTER

(75) Inventor: Dennis K. Briefer, Berlin, MA (US)

(73) Assignee: Setra Systems, Inc., Boxboro, MA (US)

( * ) Notice: Under 35 U.S.C. 154(b), the term of this patent shall be extended for 0 days.

(21) Appl. No.: 09/231,850

(22) Filed: Jan. 14, 1999

(51) Int. Cl.[7] .................................................. H03M 1/82
(52) U.S. Cl. ..................................... 341/152; 340/347 DA
(58) Field of Search ............................ 341/152, 144, 341/53, 141, 145, 110, 146; 340/347

(56) References Cited

U.S. PATENT DOCUMENTS

| | | | |
|---|---|---|---|
| 4,095,218 | 6/1978 | Crouse | 340/347 |
| 4,233,591 | 11/1980 | Murata et al. | 340/347 |
| 4,310,831 | 1/1982 | Henderson et al. | 340/347 |
| 4,532,496 | 7/1985 | Ichinose | 340/347 |
| 4,567,468 | 1/1986 | Tanaka | 340/347 |
| 4,636,773 * | 1/1987 | Lewis et al. | 340/347 DA |
| 4,742,329 * | 5/1988 | Yamada et al. | 340/347 DA |

* cited by examiner

Primary Examiner—Brian Young
Assistant Examiner—John Nguyen
(74) Attorney, Agent, or Firm—McDermott, Will & Emery

(57) ABSTRACT

A pulse width modulation digital to analog converter includes a pulse generator, a combiner and a filter. The pulse generator receives an n-bit digital word, partitions the input digital word into a plurality of sub-words, and produces a plurality of periodic pulse width modulated waveforms, each waveform's duty cycle and amplitude being representative of one of the plurality of sub-words. Since the sub-words have unique magnitude significance relative to the n-bit input word and relative to the other sub-words, each of the plurality of pulse width modulated waveforms are weighted according to the corresponding sub-word significance. The combiner receives the plurality of weighted pulse width modulated waveforms and combines them into a composite pulse width modulated waveform. The filter receives the composite periodic pulse width modulated waveform and produces an output parameter such as voltage, which corresponds to the time average of the composite waveform, where the output parameter is a function of the composite waveform's duty cycle and amplitude.

9 Claims, 4 Drawing Sheets

PULSE WIDTH MODULATION DIGITAL TO ANALOG CONVERTER

CROSS-REFERENCE TO RELATED APPLICATIONS

Not Applicable

STATEMENT REGARDING FEDERALLY SPONSORED RESEARCH

Not Applicable

REFERENCE TO MICROFICHE APPENDIX

Not Applicable

FIELD OF THE INVENTION

This invention relates to a method and apparatus for converting a digital representation of a numeric value to an analog representation of the same value, and more particularly, to a method and apparatus for converting a digital representation of a numeric value to an analog representation of the same value using pulse width modulation techniques.

BACKGROUND OF THE INVENTION

Recent advances in digital hardware and digital processing techniques have provided electrical designers powerful tools for creating a multitude of electronics applications. Many functions which have traditionally been implemented exclusively in the analog domain are now being realized via discrete, digital architectures. In many cases, a digital processing element can process a digital representation of a continuous, analog waveform with more accuracy and with less added noise than by a corresponding analog processor. However, even though digital processing is superior to analog processing in many aspects, there are still many situations in which an analog representation of a discrete digital element or series of elements is either necessary or desired. For example, a particular system may require a final output in the form of a physical, quantifiable, analog parameter such as voltage, current, resistance, light, sound, etc., even though an intermediate signal processing stage employs an efficient and accurate digital signal processor. In such cases, a digital to analog converter (hereinafter referred to as DAC) receives a digital data element from the intermediate signal processor and produces the physical parameter as a function of the digital data element. Often, the digital signal processor is implemented in software or firmware which is executed by a microprocessor or microcontroller, and a voltage level is the desired output.

Many forms of DACs exist in the prior art. Commercially available DAC integrated circuits exist which utilize various techniques to receive a digital data element and produce a corresponding voltage. However, such DAC integrated circuits can be expensive relative to the overall cost of the product into which the integrated circuit will be designed. A type of DAC especially applicable to a microprocessor based digital signal processor is the pulse width modulation (PWM) DAC. A PWM/DAC, illustrated in block diagram form in FIG. 1, includes a pulse generating unit 2, a low-pass filter element 4 and a sample-and-hold element 6. In general, the pulse generating element 2 receives a digital data element which represents a value corresponding to a unique voltage level. The pulse generating element 2 produces a periodic waveform having a duty cycle proportional to the value of the digital data element. For an N-bit digital data element which defines $2^N$ discrete states, the pulse generating element 2 produces a periodic waveform having $2^N$ equal length time slots. Each time slot is either completely filled by a pulse or completely void of a pulse, and the number of time slots containing pulses corresponds to the value of the digital data element. The filter element 4 receives the periodic waveform and provides a voltage, proportional to number of pulses per period of the periodic waveform produced by the pulse generating element 2, to the sample-and-hold element 6. The sample-and-hold element 6 samples the output of the filter element 4 and produces a voltage corresponding to the value of the digital data element. The PWMIDAC is especially suited to a microprocessor based digital signal processor because the pulse generating element can often be implemented by the microprocessor itself. Thus, the added cost in hardware is due only the filter element 4 and the sample-and-hold element 6, which may be significantly less than a DAC integrated circuit.

The lowest duty cycle condition of the PWM/DAC occurs when the value of the digital data element is such that zero time slots per period contain a pulse. The lowest non-zero duty cycle condition of the PWM/DAC occurs when the value of the digital data element is such that one and only one time slot per period contains a pulse. The filter element 4 must receive several cycles (e.g., 10 cycles) of such a low duty cycle waveform in order to produce a steady state output. Since the output of the sample-and-hold element 6 will not settle at a constant value until the filter element 4 produces a steady state output, a PWM/DAC in this example has associated with it an inherent time delay, or conversion delay, of approximately $(10)(2^N)(T_{TS})$, where $T_{TS}$ is the time duration of one time slot. As an example, for a 13 bit digital data element with) $T_{TS}=1$ $\mu$S, the inherent time delay is on the order of 82 mS. An 82 mS DAC conversion time is unacceptable for many common applications.

There is a need for a for a relatively low cost DAC with conversion times significantly less than those exhibited by prior art PWM/DACs; thus it is an object of the present invention to provide a DAC with a production cost significantly less than commercially available DAC integrated circuits.

A further object is to provide a DAC with a conversion time significantly less than prior art PWM DACs.

Other objects of the present invention will in part be evident and will in part appear hereinafter. The invention accordingly comprises the process involving the several steps and the relation and order of one or more of such steps with respect to the others and the apparatus possessing the construction, combination of elements, and arrangement of parts exemplified in the following detailed disclosure, and the scope of the application of which will be indicated in the claims.

SUMMARY OF THE INVENTION

The present invention is directed to an apparatus for producing a measurable physical parameter, the value of which is a function of an N bit digital data element. The N bit digital data element includes a J bit most significant portion and a K bit least significant portion, wherein $J+K \geq N$. The invention includes a pulse generator for receiving the digital data element and producing at least a first periodic signal and a second periodic signal. The first periodic signal has an amplitude and a duty cycle representative of the J bit most significant portion, and the second periodic signal has an amplitude less than the first amplitude and a duty cycle representative of the K bit least significant portion. In other embodiments, the amplitude of the second periodic signal is greater than or equal to the amplitude of the first periodic signal.

The invention also includes a combiner for receiving the first and second periodic signals, and for producing a periodic composite signal. The composite signal has a composite duty cycle and a plurality of composite amplitudes. The invention further includes a filter which receives the composite signal and produces the measurable physical parameter representative of composite duty cycle and plurality of composite amplitudes.

In one embodiment of the invention, the measurable physical parameter includes voltage, but in other embodiments the output of the invention may include other physical parameters such as current, resistance or power.

In another embodiment of the invention, the ratio of the second amplitude to the first amplitude is $1/(2^K)$.

In yet another embodiment of the invention, each of the first and second periodic signals include a plurality of time slots selectably occupied by a plurality of pulses as a function of the digital data element, so as to produce the first duty cycle and the second duty cycle, respectively.

In still another embodiment of the invention, the pulses are distributed uniformly over each period of the periodic signal, so as to minimize grouping of the pulses within the period.

BRIEF DESCRIPTION OF THE DRAWINGS

The foregoing and other objects of this invention, the various features thereof, as well as the invention itself, may be more fully understood from the following description, when read together with the accompanying drawings in which.

DETAILED DESCRIPTION OF THE PREFERRED EMBODIMENT

Figure 1:
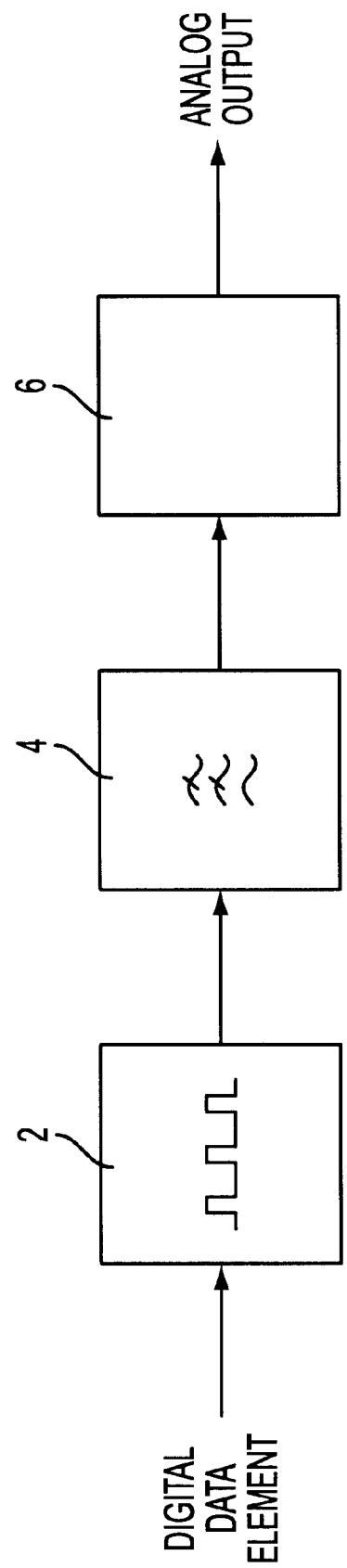
FIG. 1 shows, in block diagram form, a prior art pulse width modulated DAC.
Figure 2:
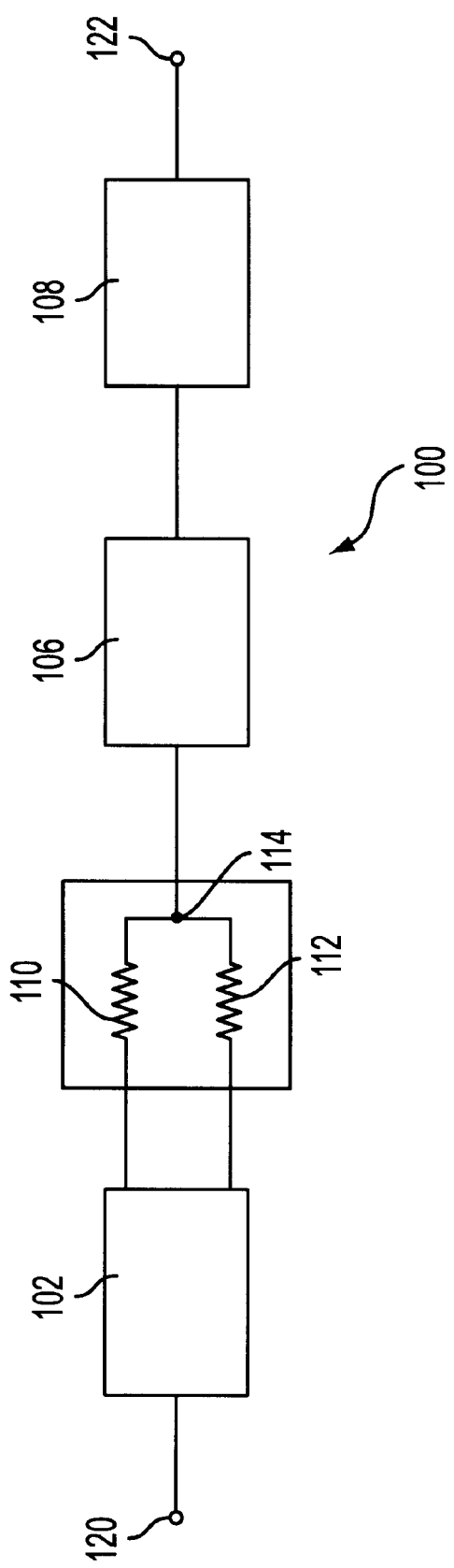
FIG. 2 illustrates, in schematic form, an exemplary embodiment of a PWM/DAC constructed in accordance with the present invention.
Figure 3:
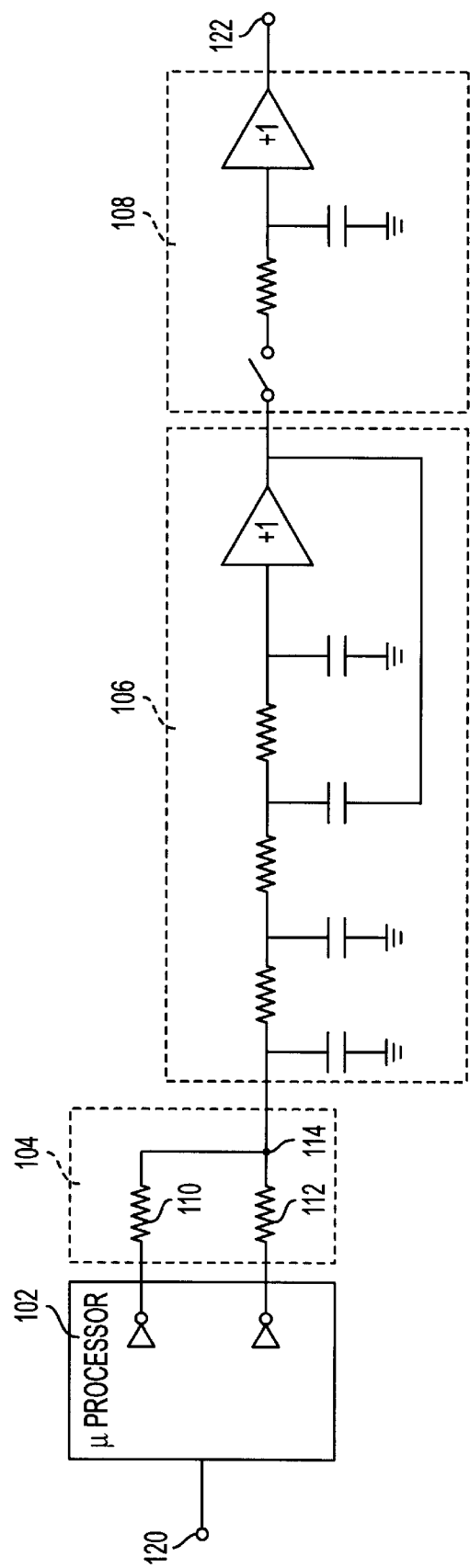
FIG. 3 illustrates an alternate embodiment of the PWM/DAC of FIG. 2.

The present invention is directed to a method and apparatus for converting a digital representation of a numeric value to an analog representation of the same numeric value using pulse width modulation (PWM) techniques. FIG. 2 illustrates an exemplary embodiment of the present invention in block diagram form, an improved pulse width modulated digital to analog converter (hereinafter referred to as a PWM/DAC). The improved PWM DAC 100 includes a pulse generator 102, a combiner 104, a filter 106 (a low-pass filter in the illustrated embodiment) and a sample-and-hold circuit 108. FIG. 3 illustrates an alternate embodiment of the PWM/DAC of FIG. 2. The pulse generator 102 receives an n-bit digital word via an input port 120 and produces a first PWM waveform having a first duty cycle and a second PWM waveform having a second duty cycle. The term "duty cycle" is used herein to denote the ratio of the amount of time in a period which is occupied by a high level (e.g., contiguous pulses) to the total amount of time in the period. The duty cycles of the first and second PWM waveforms are each dependent upon the value of the n-bit digital word. In general, the pulse generator may produce more than two PWM waveforms dependent upon the n-bit digital word. The combiner 104 receives the first and second PWM waveforms and produces a combined waveform representative of a weighted sum of the first and second PWM waveforms. The filter 106 receives the combined waveform from the combiner 104 and produces an output representative of the number of pulses per unit time in the combined waveform. The sample-and-hold circuit 108 periodically samples the output of the filtering unit 106 and provides the sampled value at the output terminal 122.

In one preferred embodiment of the PWM/DAC 100, the pulse generator 102 includes a micro-controller integrated circuit, although other embodiments may include a more sophisticated microprocessor integrated circuit (as shown in FIG. 3), or a less sophisticated state machine. In a preferred embodiment, the combiner 104 includes a first resistor 110 electrically coupled in series to a second resistor 112, forming a junction 114. The filter 106 receives the output of the combiner 104 from the junction 114, which provides a signal representative of the weighted sum of the first and second PWM waveforms. The other terminal of the first resistor 110 (i.e., the one not electrically coupled to junction 114) receives the first PWM waveform from the pulse generator 102, and the other terminal of the second resistor 112 (the one not electrically coupled to junction 114) receives the second PWM waveform from the pulse generator 102. In other forms of the invention, the combiner 104 may include a dynamically variable scaling units, such that the signal provided at the output of the combiner 104 is a time-varying weighted sum of the first and second PWM waveforms. The sample-and-hold circuit 108 receives the output of the filter 106 and provides a sampled version of the filtered output signal at terminal 122.

Figure 4:
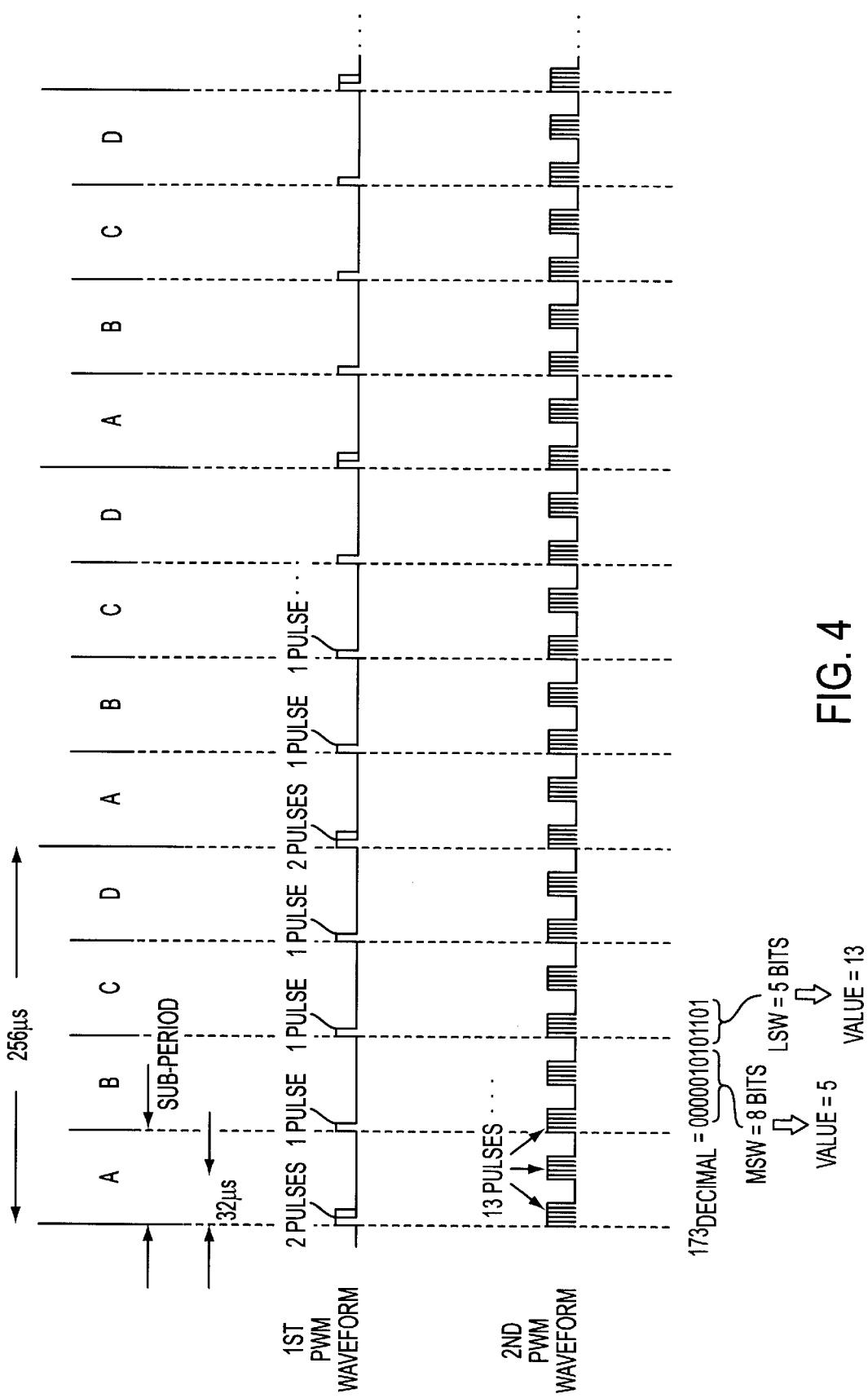
FIG. 4 illustrates the first and second PWM waveforms from the embodiment of FIG. 2.

In general, a preferred embodiment of the pulse generator 102 partitions the n-bit digital word it receives via input port 120 into a least significant word (hereinafter referred to as LSW) having j bits and a most significant word (hereinafter referred to as MSW) having k bits, where j+k=n, although other forms of the invention may not use all of the n bits available in the input digital word. FIG. 4 illustrates partitioning a 13 bit digital word into a five bit LSW and an eight bit MSW (i.e., n=13, j=5 and k=8). The pulse generator produces the first periodic PWM waveform having a first duty cycle dependent upon the value of the k-bit MSW, and produces the second periodic PWM waveform having a duty cycle dependent upon the value of the j-bit LSW. Other forms of the invention may partition the n-bit digital word into more than two words, so that the pulse generator 102 produces more than two PWM waveforms, each dependent upon one of the sub-divided digital words. In the first periodic PWM waveform of the illustrated embodiment, the period is partitioned into m equal sub-periods, and pulses in the PWM waveform are uniformly distributed among the sub-periods. Each of the sub-periods is "filled" from the beginning of the sub-period, as described in more detail herein. Distributing the pulses among sub-periods within the primary period results in a waveform with a higher fundamental frequency than if the pulses were grouped within one portion of each period of the waveform. Variance from strict of pulse distribution uniformity may also be used, at the cost of a corresponding loss of performance. The distribution of pulses among sub-periods may also be performed in the second periodic PWM waveform, although the benefits of doing so are less pronounced, since the first PWM waveform is given much greater weight than the second PWM waveform, corresponding to the relative values of the MSW and the LSW, when combined by the combiner 104. In other forms of the invention, the pulse distribution may be non-uniform so as to generate a waveform having different spectral characteristics than the illustrated embodiment; in general, the pulse distribution may be tailored so as to provide desired spectral characteristics.

In an exemplary embodiment, the input digital word includes 13 bits, the least significant word includes 5 bits, and the most significant word includes 8 bits. The period of the first PWM waveform is 256 µS, the period of the second PWM waveform is 32 µS, and the pulse resolution of the PWM waveform (i.e., the width of each pulse) is 1 µS. The first periodic PWM waveform is partitioned into four sub-periods labeled sub-period A through sub-period D, each of which is 64 µS in duration. Alternate embodiments of the invention may have more or less sub-periods.

FIG. 4 illustrates the first and second PWM waveforms from this exemplary embodiment, with a 13 bit input digital word having a decimal equivalent value of 173. As FIG. 4 shows, a digital word having a decimal equivalent value of 173 has a binary representation of 0000010101101, which results in a LSW of 01101 and a MSW of 00000101. Thus, the LSW has a decimal equivalent value of 13 and the MSW has a decimal equivalent value of 5. The first PMW waveform has 5 µS pulses in each 256 µS period, with one at the beginning of each 64 µS sub-period and the fifth pulse being inserted adjacent to and immediately following the first pulse in the first sub-period. Thus, the duty cycle of the first PMW waveform is 5/256 or 0.01953125. In the embodiment illustrated in FIG. 4, the sequence of filling sub-periods is A, C, B, D, A, C, B ..., until all pulses defined by the MSW have been distributed. Such a sequence of filling sub-periods assures uniform spectral characteristics of the PWM waveform as the number of pulses to be distributed increases. In alternate embodiments, other fill sequences may be used to provide different spectral characteristics. The second PMW waveform has 13 adjacent 1 µS pulses in each 32 µS period, starting at the beginning of the period. In the illustrated embodiment, the pulses in the second PMW waveforn are not uniformly distributed among sub-periods, although other embodiments may perform such a distribution, similar to that described for the first PMW waveform.

In this embodiment, the first and second PWM waveforms are combined contemporaneously, so a pulse from each of the two waveforms may exist simultaneously. In other embodiments of the invention, the duty cycles of the waveforms may be extended so that the pulses from the waveforms occur consecutively. In such an embodiment, pulses from different waveforms will never exist simultaneously.

In the illustrated embodiment, the first PWM waveform is applied to one input of the first resistor 110 and the second PWM waveform is applied to one input of the second resistor 112. Since the value of the least significant bit of the 8 bit MSW is 32 times the value of the least significant bit of the 5 bit LSW, the ratio of the value of the second resistor 112 to the value of the first resistor 110 must be 32 to 1 so as to provide proper weighting for the subsequent combination of the waveforms. In one preferred embodiment, the second resistor 112 has a value of 640,000 ohms with a tolerance of ±1%, and the first resistor 110 has a value of 20,000 ohms with a tolerance of ±1%. A ±1% tolerance is adequate to assure a 32:1 ratio (±1/64). Other resistor values having different tolerances may be used, as long as the ratio of the resistors is consistent with the relationship between the MSW and the LSW as described herein.

The PWM DAC 100 combines the two weighted waveforms at the junction 114 of the two resistors 110 and 112.

The filter 106 receives the combined PWM waveform from junction 114 and produces an output corresponding to a time-average of the signal at the junction 114. In general, the output of the filter 106 is directly proportional to the number of pulses present, per unit time, at the junction 114. Since pulses from the first PWM waveform are more heavily weighted than pulses from the second PWM waveform, pulses from the first PWM waveform have a more significant effect on the output of the filter 106 than do pulses from the second PWM waveform.

The sample-and-hold circuit 108 provides a "snapshot" of the output of the filter 106 so that variations of the filter 106 output will not translate to the final output of the PWM/AC 100. When the n-bit digital word at input port 120 changes in value, the duty cycles of the first PWM waveform and the second PWM waveform also change. This change will cause a transient in the output of the filter 106. Eventually the output of the filter will reach a steady state value, but not until it has received several periods of the first and second PWM waveforms. The sample-and-hold circuit 108 prevents this continuous-time transient from reaching the output of the PWM/DAC 100.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. An apparatus for producing a measurable physical parameter having a first value, said first value being a function of an N bit digital data element, said digital data element having a 3 bit most significant portion and a K bit least significant portion, comprising:

a pulse generator for receiving said digital data element and producing at least a first periodic signal and a second periodic signal, said first periodic signal having a first amplitude and a first duty cycle representative of said J bit most significant portion, said second periodic signal having a second amplitude and a second duty cycle representative of said K bit least significant portion;

a combiner for receiving said first periodic signal and said second periodic signal, and for producing a periodic composite signal having a composite duty cycle and a plurality of composite amplitudes; and a filter for receiving said composite signal and producing said physical parameter, said first value being representative of said composite duty cycle and said plurality of composite amplitudes, wherein a ratio of said second amplitude to said first amplitude is $1/(2^K)$.

2. An apparatus according to claim 1, wherein said pulse generator dynamically controls said first amplitude and said second amplitude over said first periodic signal and said second periodic signal, respectively.

3. An apparatus according to claim 1, wherein each of said first and second periodic signals include a plurality of time slots selectably occupied by a plurality of pulses as a function of said digital data element, so as to produce said first duty cycle and said second duty cycle, respectively.

4. An apparatus according to claim 3, wherein said first periodic signal includes $2^J$ time slots and said second periodic signal includes $2^K$ time slots.

5. An apparatus according to claim 3, said pulses being distributed uniformly over each period of said periodic signal, so as to minimize a grouping of said pulses within said period.

6. An apparatus according to claim 3, said pulses being distributed within each period of said periodic signal, said period having a duration T, among time slots beginning at the start of the period $T_0$, at $T_0+T/4$, at $T_0+T/2$ and at $T_0+3T/4$, such that said pulses are equally allotted, first to time slots beginning at $T_0$, then to time slots beginning at $T_0+T/2$, then to time slots beginning at $T_0+T/4$, then to time slots beginning at $T_0+3T/4$.

7. An apparatus according to claim 1, wherein said first periodic signal and said second periodic signal are combined contemporaneously.

8. An apparatus according to claim 1, wherein said first periodic signal and said second periodic signal are combined sequentially, so as to preclude pulses of said first periodic signal and said second periodic signal from occurring in a common time slot.

9. An apparatus for producing a measurable physical parameter having a first value, said first value being a function of an N bit digital data element, said digital data element having a J bit most significant portion and a K bit least significant portion, comprising:

a pulse generator for receiving said digital data element and producing at least a first periodic signal and a second periodic signal, said first periodic signal having a first amplitude and a first duty cycle representative of said J bit most significant portion, said second periodic signal having a second amplitude and a second duty cycle representative of said K bit least significant portion;

a combiner for receiving said first periodic signal and said second periodic signal, and for producing a periodic composite signal having a composite duty cycle and a plurality of composite amplitudes; and, a filter for receiving said composite signal and producing said physical parameter, said first value being representative of said composite duty cycle and said plurality of composite amplitudes, wherein each of said first and second periodic signals include a plurality of time slots selectably occupied by a plurality of pulses as a function of said digital data element, so as to produce said first duty cycle and said second duty cycle, respectively, said pulses being distributed within each period of said periodic signal, said period having a duration T, among time slots beginning at the start of the period $T_0$, at $T_0+T/4$, at $T_0+T/2$ and at $T_0+3T/4$, such that said pulses are equally allotted, first to time slots beginning at $T_0$, then to time slots beginning at $T_0+T/2$, then to time slots beginning at $T_0+T/4$, then to time slots beginning at $T_0+3T/4$.

* * * * *